US011722107B2

(12) United States Patent
Melanson et al.

(10) Patent No.: US 11,722,107 B2
(45) Date of Patent: Aug. 8, 2023

(54) ZERO-CROSSING MANAGEMENT IN CLASS-D AUDIO AMPLIFIERS

(71) Applicant: CIRRUS LOGIC INTERNATIONAL SEMICONDUCTOR LTD., Edinburgh (GB)

(72) Inventors: John L. Melanson, Austin, TX (US); Cory J. Peterson, Austin, TX (US); Chandra Prakash, Austin, TX (US); Ramin Zanbaghi, Austin, TX (US); Eric Kimball, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/589,047

(22) Filed: Jan. 31, 2022

(65) Prior Publication Data

US 2022/0247367 A1   Aug. 4, 2022

Related U.S. Application Data

(63) Continuation-in-part of application No. 17/161,815, filed on Jan. 29, 2021, now Pat. No. 11,309,853.

(51) Int. Cl.
*H03F 3/217* (2006.01)
*H03F 3/187* (2006.01)
*H03F 1/26* (2006.01)

(52) U.S. Cl.
CPC ............ *H03F 3/2178* (2013.01); *H03F 1/26* (2013.01); *H03F 3/187* (2013.01); *H03F 2200/03* (2013.01)

(58) Field of Classification Search
CPC .......... H03F 3/2178; H03F 1/26; H03F 3/187; H03F 2200/03; H03F 3/45475; H03F 3/68; H03F 3/2173
(Continued)

(56) References Cited

U.S. PATENT DOCUMENTS 7,053,806 B1   5/2006 Rao et al.
8,139,792 B2   3/2012 Magrath
(Continued)

OTHER PUBLICATIONS

International Search Report and Written Opinion in PCT/US2022/014577 dated Jun. 29, 2022 (pp. 1-14 in pdf).
(Continued)

*Primary Examiner* — Hieu P Nguyen
(74) *Attorney, Agent, or Firm* — Mitch Harris, Atty at Law, LLC; Andrew M. Harris

(57) ABSTRACT

Class-D amplifier circuits provide operation with low-distortion zero crossings outside of a unipolar power supply voltage range. The amplifiers include a first H-bridge driver circuit and a second H-bridge driver circuit. The class-D amplifier circuits also include a control circuit having an input for receiving an input signal to be reproduced by the class-D amplifier circuit. The control circuit has outputs coupled to inputs of the first and second H-bridge drivers, and includes one or more modulators. The control circuit selects between actively operating a selected one of the driver circuits or both, according to the signal to be reproduced, while setting an unselected driver circuit to turn either a high-side switch or a low-side switch of the unselected one of the first driver circuit or the second driver circuit fully on for at least some cycles of the one or more modulators.

22 Claims, 11 Drawing Sheets

(58) Field of Classification Search
USPC ........................................ 330/10, 207 A, 251
See application file for complete search history.

(56) References Cited

U.S. PATENT DOCUMENTS

| | | |
|---|---|---|
| 8,803,569 B1 | 8/2014 | Malladi et al. |
| 9,319,033 B1 | 4/2016 | Jin et al. |
| 10,034,085 B2 | 7/2018 | Cho et al. |
| 10,298,188 B2 | 5/2019 | Kiyono |
| 10,439,539 B2 | 10/2019 | Lopez et al. |
| 10,547,267 B2 | 1/2020 | Li et al. |
| 10,734,981 B1 | 8/2020 | Zanbaghi |
| 11,037,596 B2 | 6/2021 | Miura |
| 11,115,046 B2 | 9/2021 | Parupalli et al. |
| 2007/0229159 A1* | 10/2007 | Krishnan ................ H03F 3/217 |
| | | 330/253 |
| 2009/0201083 A1 | 8/2009 | Guanziroli et al. |
| 2021/0351751 A1 | 11/2021 | Zanbaghi et al. |

OTHER PUBLICATIONS

U.S. Appl. No. 17/151,877, entitled Dual-Channel Class-D Audio Amplifier Having Quantizer-Combined Orthogonal Modulation, filed Jan. 19, 2021.

* cited by examiner

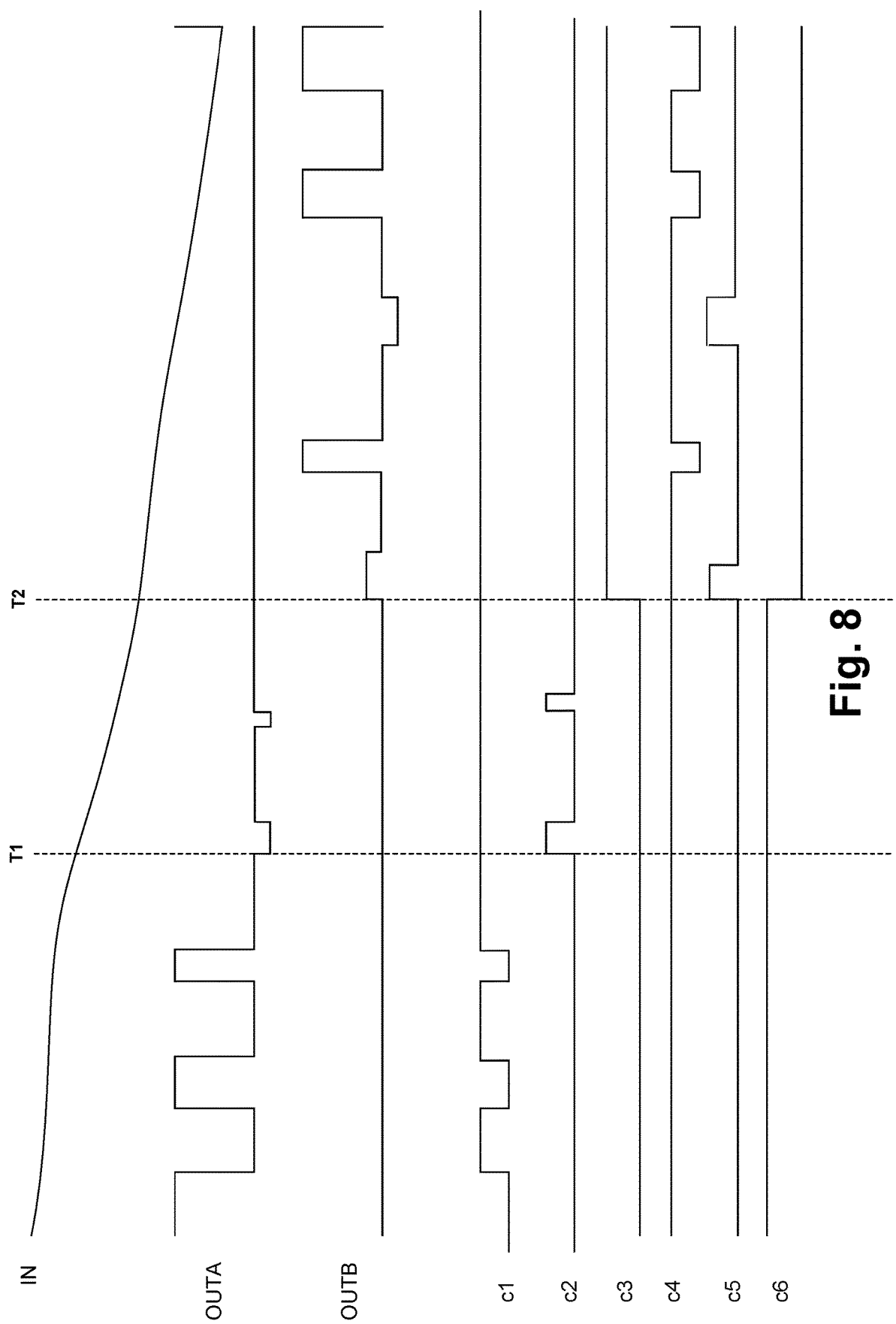

ZERO-CROSSING MANAGEMENT IN CLASS-D AUDIO AMPLIFIERS

BACKGROUND

1. Field of Disclosure

The field of representative embodiments of this disclosure relates to Class-D audio amplifier or haptic driver methods and circuits that have asymmetric output rail voltages and zero-crossing management in such amplifiers.

2. Background

Audio amplifiers, and other amplifiers such as those for driving haptic feedback devices, may be implemented with Class-D (switching) power amplifiers and are frequently implemented with differential H-bridge output stages. When operating such amplifiers with a low-amplitude output signal, as the output voltage nears one of the power supply rails, neither of the drivers in the H-bridge can strongly control the output signal, as the effective output impedance of the switching devices rises rapidly as the device is required to provide a current source/sink with a voltage drop across the switching devices approaching zero. The result is that the common-mode voltage of the outputs must be set somewhere between the power supply rails, which reduces the potential signal swing and efficiency of the amplifier, otherwise distortion will be produced in the output signal at low amplitudes.

Therefore, it would be desirable to provide a class-D amplifier that is capable of low-distortion operation near one of the power supply rails with a common mode voltage also near or at one of the power supply rails.

SUMMARY

Improved class-D amplifier operation is accomplished in Class-D amplifier circuits, integrated circuits including Class-D amplifiers and their methods of operation.

The class-D amplifier circuits include a first driver circuit including a first high-side switch coupling a first output of the class-D amplifier to a positive power supply and a first low-side switch coupling the first output of the class-D amplifier to a negative power supply and a second driver circuit including a second high-side switch coupling a second output of the class-D amplifier to a positive power supply and a second low-side switch coupling the second output of the class-D amplifier to a negative power supply. The class-D amplifier circuits also include a control circuit having an input for receiving an input signal to be reproduced by the class-D amplifier circuit. The control circuit has a first output coupled to an input of the first driver circuit and a second output coupled to an input of the second driver circuit, and includes one or more modulators. The control circuit selects between actively operating a selected one of the first driver circuit or the second driver circuit or both the first driver circuit and the second driver circuit according to the signal to be reproduced, while setting an unselected one of the first driver circuit or the second driver circuit to turn either a high-side switch or a low-side switch of the unselected one of the first driver circuit or the second driver circuit fully on for at least some cycles of the one or more modulators.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

BRIEF DESCRIPTION OF THE DRAWINGS

FIG. 8 and FIG. 9 are example signal waveform diagrams illustrating operation of example class-D amplifier of FIG. 6, in accordance with embodiments of the disclosure.

DESCRIPTION OF ILLUSTRATIVE EMBODIMENT

The present disclosure encompasses circuits and integrated circuits that include improved Class-D amplifier circuits and their method of operation. The class-D amplifier includes a first differential modulator circuit, a first driver circuit including a first high-side switch coupling the first output of the class-D amplifier to a positive power supply and a first low-side switch coupling the first output of the class-D amplifier to a negative power supply. An input of the first driver circuit is coupled to a first output of the first differential modulator circuit so that the first differential modulator circuit controls the first driver circuit. The class-D amplifier also includes a second driver circuit including a second high-side switch coupling a second output of the class-D amplifier to a positive power supply and a second low-side switch coupling the second output of the class-D amplifier to a negative power supply and control logic that selects between a single-ended operating state and a differential operating state of the class-D amplifier circuit. The control logic has a first input coupled to a second output of the first differential modulator circuit, and an input of the second driver circuit is coupled to an output of the control logic block. The control logic may selectively determine the input of the second driver circuit in conformity with a current operating state of the class-D amplifier circuit.

Figure 1A:
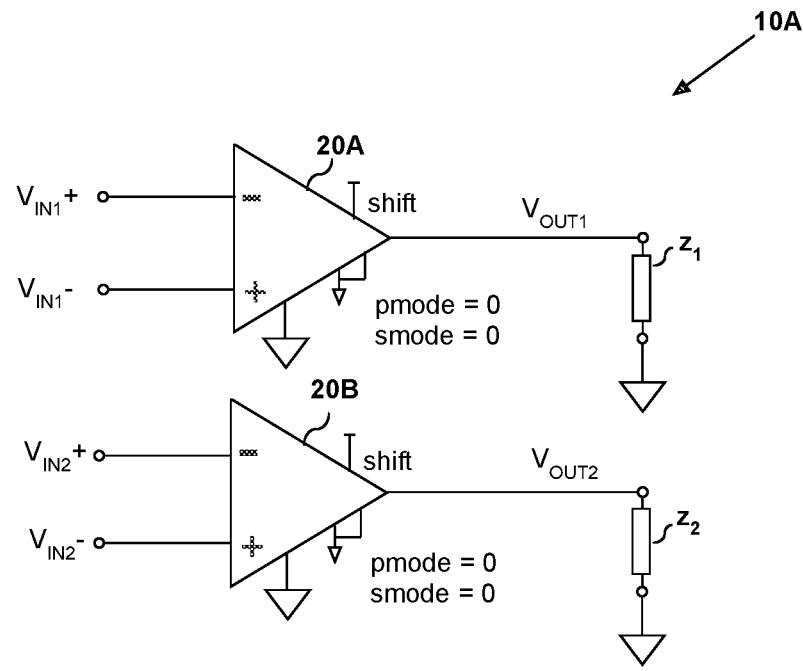
FIG. 1A is a circuit diagram showing multiple example amplifier channels operated in a single ended configuration 10A and FIG. 1B is a circuit diagram showing the multiple amplifiers 20A, 20B operated in a differential configuration 10B, in accordance with an embodiment of the disclosure.
Figure 1B:
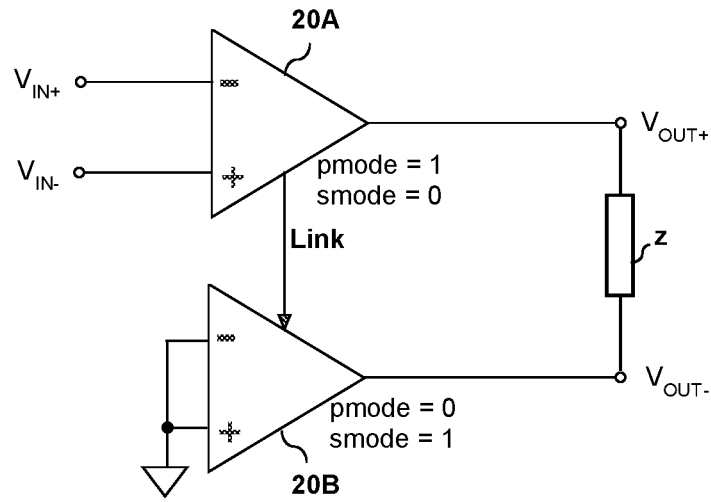

Referring now to FIG. 1A, an example of multiple example amplifier channels operated in a single ended configuration 10A. Two selection inputs are provided at each of amplifier 20A and amplifier 20B and select between a single-ended dual channel operating state or a differential operating state as shown in FIG. 1B. If selection input pmode and input smode are both set to a logical-zero value, Amplifier 20A reproduces a signal representative of a differential input signal pair $V_{IN1+}$, $V_{IN1-}$ at output $V_{OUT1}$ to drive load $z_1$, and Amplifier 20B reproduces a signal representative of a differential input signal pair $V_{IN2+}$, $V_{IN2-}$ at output $V_{OUT2}$. If selection input pmode is set to a logical-1 value on a first one of the amplifiers, e.g., amplifier 20A in FIG. 1B, and selection input smode is set to a logical-1 value on the second one of the amplifiers, e.g., amplifier 20B as shown in FIG. 1B, then amplifier 20A becomes a primary amplifier that controls amplifier 20B, which becomes a secondary amplifier. A Link signal provides an analog of a difference between a pair of differential input signals $V_{IN+}$ and $V_{IN-}$ to amplifier 20B, which provides an inverted version of output $V_{OUT+}$ of amplifier 20A at output $V_{OUT-}$, resulting in a differential drive signal across a load z.

Figure 2:
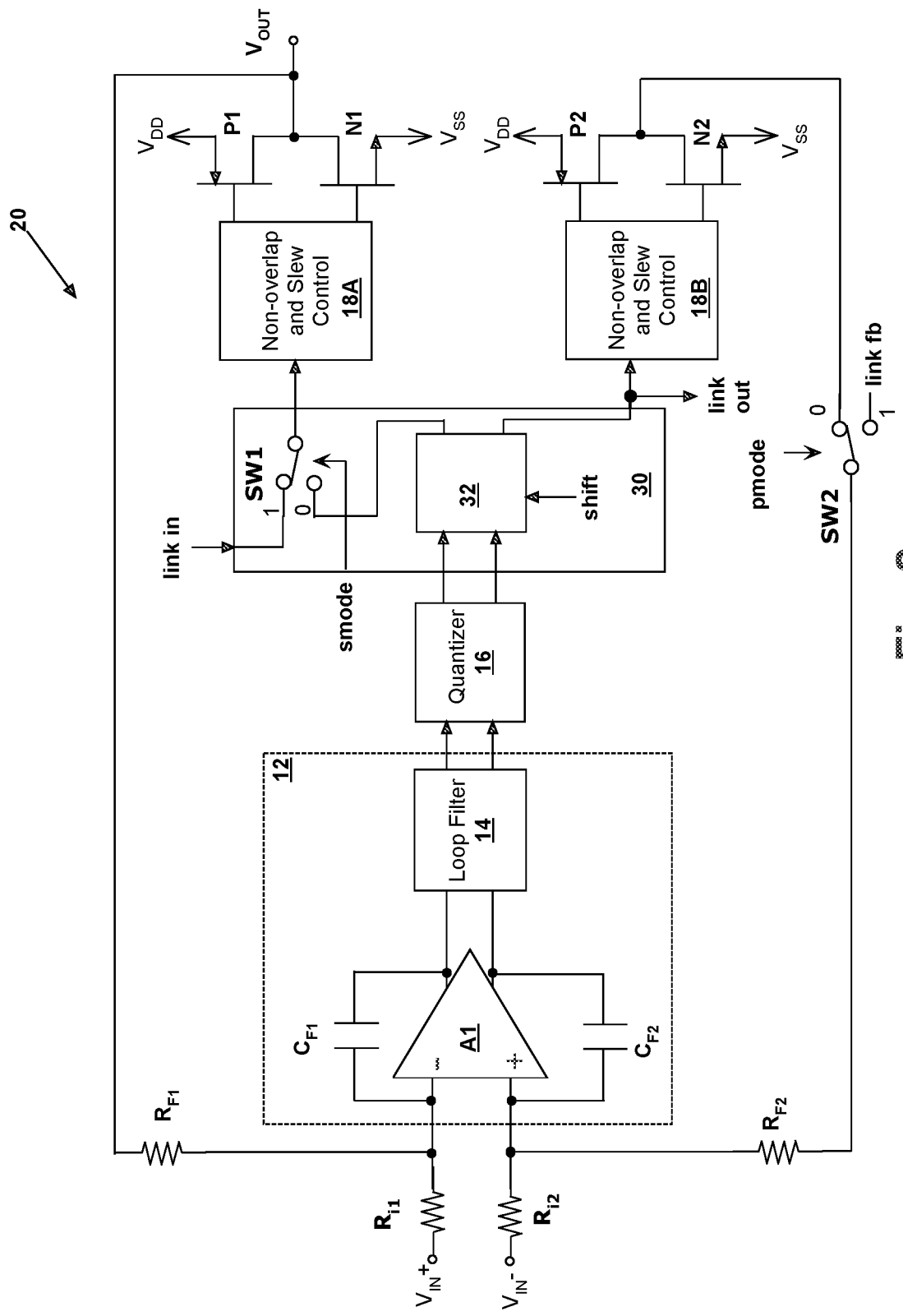
FIG. 2 is a simplified schematic diagram of an example amplifier channel 20 that may be used to implement amplifiers 20A, 20B of FIG. 1A and FIG. 1B, in accordance with an embodiment of the disclosure.

Referring now to FIG. 2, a simplified schematic diagram of an example amplifier channel 20 that may be used to implement amplifiers 20A, 20B of FIG. 1A and FIG. 1B is shown, in accordance with an embodiment of the disclosure. A fully-differential integrator 12 provided by amplifier A1, feedback capacitors $C_{F1}$, $C_{F2}$ and input resistors $R_{i1}$, $R_{i2}$ provides an input signal to a loop filter 14 that is also fully-differential. The differential output of loop filter 14 is provided to a quantizer 16, having a differential pulse-width modulated (PWM) output that is provided to a control logic block 30. A pair of outputs of control logic block are provided to inputs of corresponding non-overlap and skew control blocks 18A, 18B that are formed by analog or analog/digital hybrid networks. Non-overlap and skew control blocks 18A, 18B condition the risetimes of the outputs of control logic block 30 and prevent switching overlap between a pair of outputs of each of non-overlap and skew control blocks 18A, 18B that drive corresponding high-side switching transistors P1, P2 and corresponding low-side switching transistors N1, N2. An output signal of amplifier 20 is provided from the output driver formed by high-side switching transistor P1 and low-side switching transistor N1. A feedback driver circuit is provided by high-side switching transistor P2 and low-side switching transistor N2, which provides for a fully-differential feedback via feedback resistor $R_{F2}$, which along with feedback resistor $R_{F1}$, provide closed-loop sigma-delta operation of integrator 12 and quantizer 16.

When a pair of amplifiers 20 are operated in differential mode as exemplified in FIG. 1B, switch S1 in control logic block 30, which receives a signal from another amplifier's control loop at input link in, directs that signal to the input of non-overlap and skew control block 18A. The selection occurs when amplifier 20 is selected as the secondary amplifier when selection input smode is asserted as described above. Otherwise, the input of non-overlap and skew control block 18A is provided by the non-inverting output of quantizer 16, which is provided from a pulse-state blocking control block 32, details of which are described below. Since signal link out is provided from the inverting output of quantizer 16, the signal received at input link in of the secondary amplifier is complementary to the signal link out provided to the input of non-overlap and skew control 18A of the primary amplifier, fully differential operation occurs using the modulator in the primary amplifier as the modulating source for both amplifiers. The feedback path from the feedback driver circuit provided by high-side switching transistor P2 and low-side switching transistor N2 is provided from an input link fb when amplifier 20 is selected as the primary amplifier, i.e., when selection input pmode is asserted to activate switch S2 to apply input link fb to feedback resistor $R_{F2}$. Input link fb is received from the output of the secondary amplifier, which in the example is amplifier 20B. The resulting operation of a pair of amplifiers 20, when the above-described selections and connections are made, is that the output driver circuit of both the primary and the secondary amplifier are operated with the complementary outputs of quantizer 16 of the primary amplifier, providing true differential operation. The feedback drivers in both amplifiers may be either operated or disabled, as their outputs are no longer used to supply feedback to the integrator in the primary amplifier, which generates all of the control of the pulse-width of the outputs of both amplifiers. The integrator and loop filter in the secondary amplifier may also be disabled to conserve power.

In a single-ended operating state as shown in FIG. 1A, since the return path of current from output $V_{OUT}$ is $V_{SS}$, which is ground in the example of FIG. 1A, in order to operate amplifier 20 without drawing excessive current from amplifier 20 through the connected load, the DC operating point of output $V_{OUT}$ is ideally very near ground, e.g., less than 1 Volt for a 5 Volt power supply, which would generally require that the quiescent operating point of quantizer 16 be close to 80% duty cycle, dramatically reducing the available dynamic range in the positive swing direction. Alternatively, the load could be connected to the positive power supply rail, but that would require the quiescent operating point of quantizer 16 to be near 20% duty cycle. A pulse-state blocking logic block 32 within control logic alters the output of quantizer 16 in order to shift the operating point of quantizer 16 to be near a midpoint (50% duty cycle), which maximizes the available dynamic range and improves SNR and DNR performance. While the example given above is with reference to PWM Class-D amplifiers, the instant disclosure encompasses other modulation techniques such as constant-edge modulation (CEM) and pulse-density modulation (PDM), which also operate with an effective duty-cycle that is comparable to PWM when viewed over a number of cycles.

In the instant example, the shift in quiescent operating point is accomplished when control input shift provided to control logic 30 is asserted, which activates pulse-state blocking logic block 32. Pulse-state blocking logic block 32 modifies the outputs quantizer 16 that is provided to non-overlap and skew control blocks 18A, 18B, by preventing the switching state of the output driver formed by high-side switching transistor P1 and low-side switching transistor N1 and the feedback driver circuit provided by high-side switching transistor P2 and low-side switching transistor N2, from assuming a state in which both high-side drivers are active, i.e., switching transistor P1 and switching transistor P2 are both on. The result is a shift in the quiescent value of output $V_{OUT}$ to a voltage near ground. For implementations in which the load is connected between output $V_{OUT}$ and power supply rail $V_{DD}$, pulse-state blocking logic block 32 blocks the state in which both switching transistor N1 and switching transistor N2 would otherwise be on. Control input shift may be asserted or left de-asserted when the differential operating state is selected, as long as the control logic implementing pulse-state blocking logic block 32 is the same for both amplifiers, as operation in a differential operating state does not require otherwise forcing quantizer 16 to operate near one of the power supply rails $V_{DD}$ or $V_{SS}$.

Figure 3A:
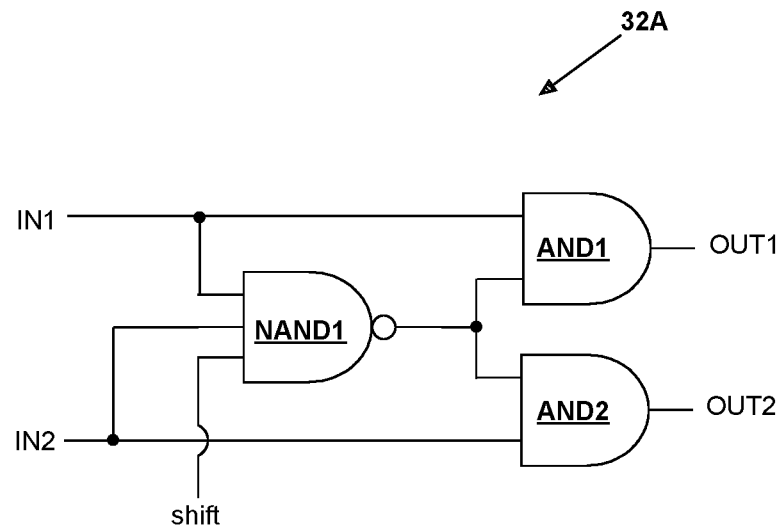
FIG. 3A is a schematic diagram showing an example of a pulse-state suppression logic circuit 32A that may be used to implement pulse-state suppression logic block 32 of FIG. 2, in accordance with an embodiment of the disclosure.

Referring now to FIG. 3A, a schematic diagram showing an example of a pulse-state suppression logic circuit 32A that may be used to implement pulse-state suppression logic block 32 of FIG. 2 is shown, in accordance with an embodiment of the disclosure. The outputs of quantizer 16 are provided to inputs IN1 and IN2 of pulse-state suppression logic block 32A. When control signal shift is de-asserted, the output of a logical-NAND gate NAND1 is held in the logical 1 state, enabling input IN1 onto output OUT1 of logical-AND gate AND1 and input IN2 onto output OUT2 of logical-AND gate AND2, which, other than any logic delay, is as if the outputs of quantizer 16 were connected directly to the corresponding inputs of non-overlap and skew control blocks 18A, 18B. When control input shift is asserted, and when both inputs IN1 and IN2 are in the logical 1 state, the output of logical-NAND gate NAND1 assumes the logical 0 state, and output OUT1 of logical-AND gate AND1 and the output of logical-AND gate AND2 are set to the logical-0 state, blocking the activation of both high-side switching transistors P1 and P2, assuming that non-overlap and skew control blocks 18A, 18B act as inverters, i.e., the sense of an output of quantizer 16 and the output of the corresponding output driver circuit are the same.

Figure 3B:
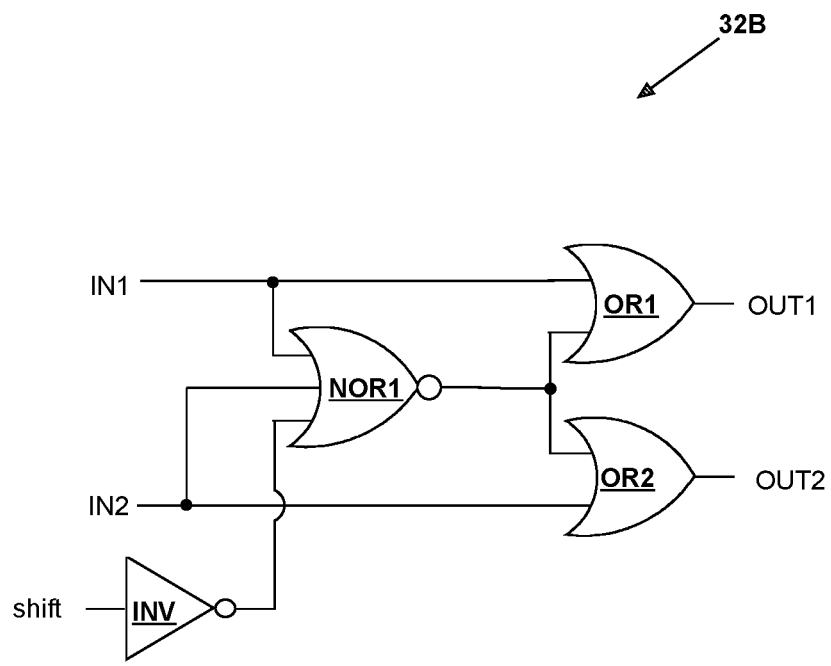
FIG. 3B is a schematic diagram showing an alternative example of a pulse-state suppression logic circuit 32B that may be used to implement pulse-state suppression logic block 32 of FIG. 2, in accordance with another embodiment of the disclosure.

Referring now to FIG. 3B, a schematic diagram showing an alternative example of a pulse-state suppression logic circuit 32B that may be used to implement pulse-state suppression logic block 32 of FIG. 2, in accordance with another embodiment of the disclosure. The depicted embodiment blocks the state in which low-side switching transistors N1 and N2 are turned on, in accordance with the alternative example described above. The outputs of quantizer 16 are provided to inputs IN1 and IN2 of pulse-state suppression logic block 32B. When control signal shift is de-asserted, thereby asserting the output of an inverter INV, the output of a logical-NOR gate NOR1 is held in the logical 0 state, enabling input IN1 onto output OUT1' of a logical-OR gate OR1 and input IN2 onto output OUT2' of a logical-OR gate OR2, which, other than any logic delay, is as if the outputs of quantizer 16 were connected directly to the corresponding inputs of non-overlap and skew control blocks 18A, 18B. When control input shift is asserted, and when both inputs IN1 and IN2 are in the logical 0 state, the output of logical-NOR gate NOR1 assumes the logical 1 state, and output OUT1' of logical-OR gate OR1 and the output of logical-OR gate OR2 are set to the logical-1 state, blocking the activation of both low-side switching transistors N1 and N2, assuming that non-overlap and skew control blocks 18A, 18B act as inverters, i.e., the sense of an output of quantizer 16 and the output of the corresponding output driver circuit are the same.

Figure 4:
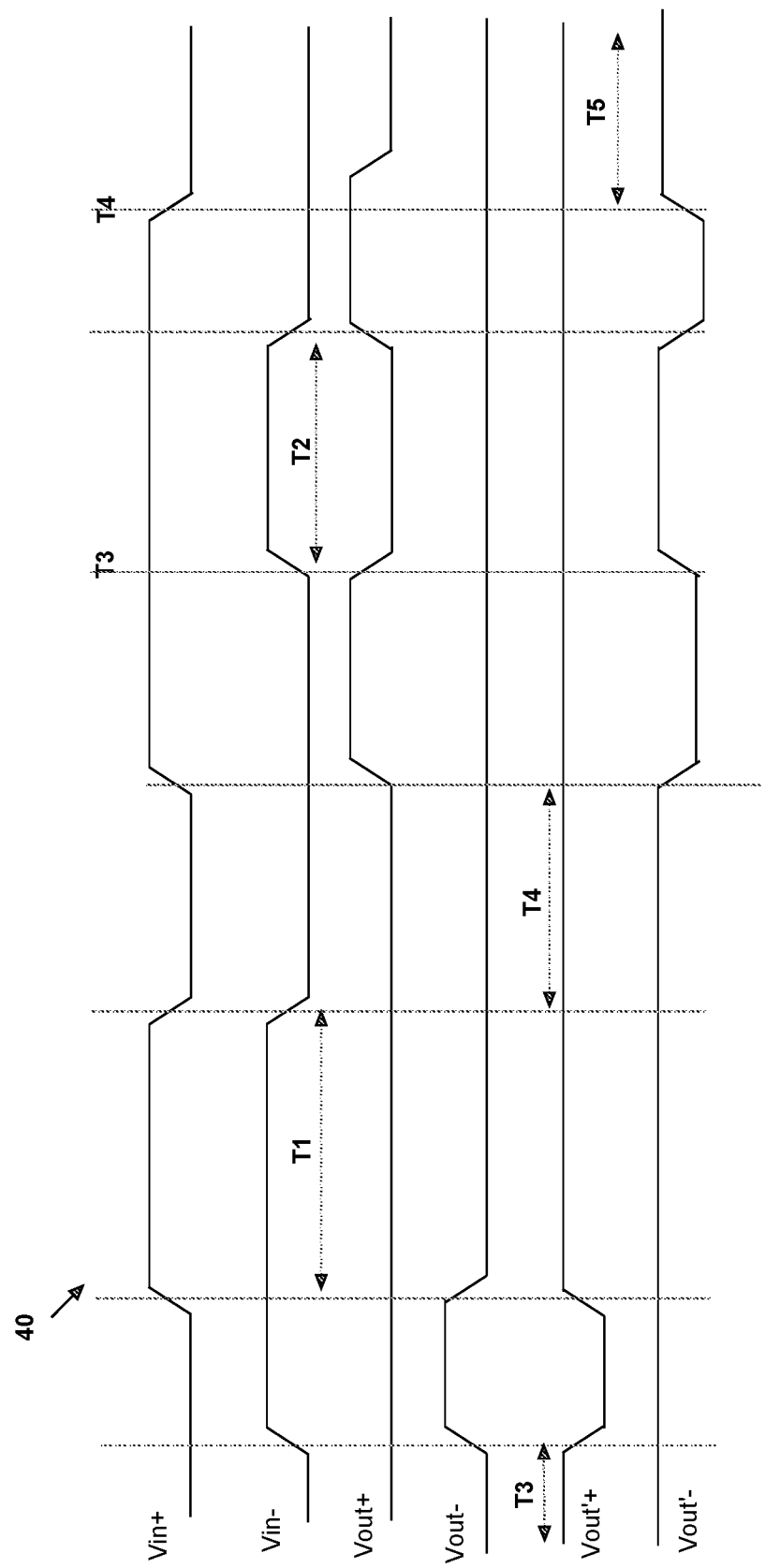
FIG. 4 is an example signal waveform diagram 40 illustrating operation of example pulse-state suppression logic 32A of FIG. 3A and example pulse-state suppression logic 32B of FIG. 3B, in accordance with another embodiment of the disclosure.

Referring now to FIG. 4, an example signal waveform diagram 40 illustrating operation of example pulse-state suppression logic 32A of FIG. 3A and example pulse-state suppression logic 32B of FIG. 3B is shown, in accordance with another embodiment of the disclosure. Signals Vin+ and Vin− correspond in polarity to the inputs IN1, IN2 of pulse-state suppression logic 32A and 32B. Signals Vout+ and Vout− are the output driver signal states for an amplifier 20 that blocks simultaneous assertion of two high-side pulses, e.g., an amplifier 20 that incorporates pulse-state suppression logic 32A. Signals Vout+ and Vout−, track their respective input signals Vin+ and Vin− except during time intervals T2 and T4, in which a "00" state is produced instead of state "11". Similarly, signals Vout'+ and Vout'− are the output driver signal states for an amplifier 20 that blocks simultaneous assertion of two low-side pulses, e.g., an amplifier 20 that incorporates pulse-state suppression logic 32B. Signals Vout'+ and Vout'−, track their respective input signals Vin+ and Vin− except during time intervals T1, T3 and T4, in which a "11" state is produced instead of state "00".

Figure 5:
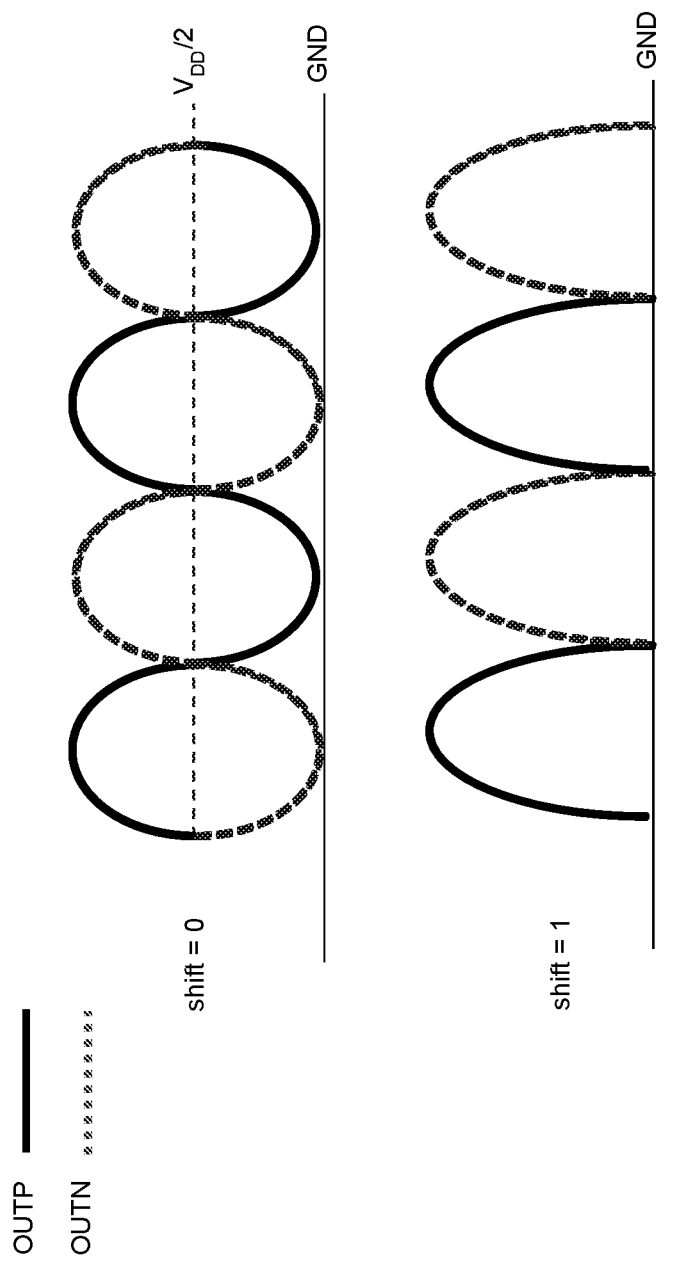
FIG. 5 is an example signal waveform diagram illustrating operation of example amplifier channel 20 of FIG. 2, in accordance with an embodiment of the disclosure.

Referring now to FIG. 5, an example signal waveform diagram illustrating operation of example amplifier channel 20 of FIG. 2 is shown, in accordance with an embodiment of the disclosure. The dashed portions of the waveforms (OUTN) correspond to the feedback driver output, and thus are not produced externally. The solid portions of the waveforms (OUTP) correspond to the amplifier driver output $V_{OUT}$, i.e., the output of amplifier 20. When control signal shift is de-asserted as illustrated in the top of FIG. 5, which is also representative of an amplifier that does not contain pulse-state blocking logic block 32, the average value of the output, i.e., the common-mode value of the output is $V_{DD}/2$, which, as described above, will waste excessive power and send a relatively large amount of current through a voice-coil type load. The bottom portion of FIG. 5 illustrates the output of amplifier 20 when control signal shift is asserted, in which the average value is much lower, e.g., $V_{DD}/5$, which for an amplifier 20 operated from a 5 Volt power supply is a change from 2.5V to 0.5V in output offset. At a minimum, the average output voltage is half that of the upper portion of the Figure, since the output of amplifier 20 is active only half of the time.

Figure 6:
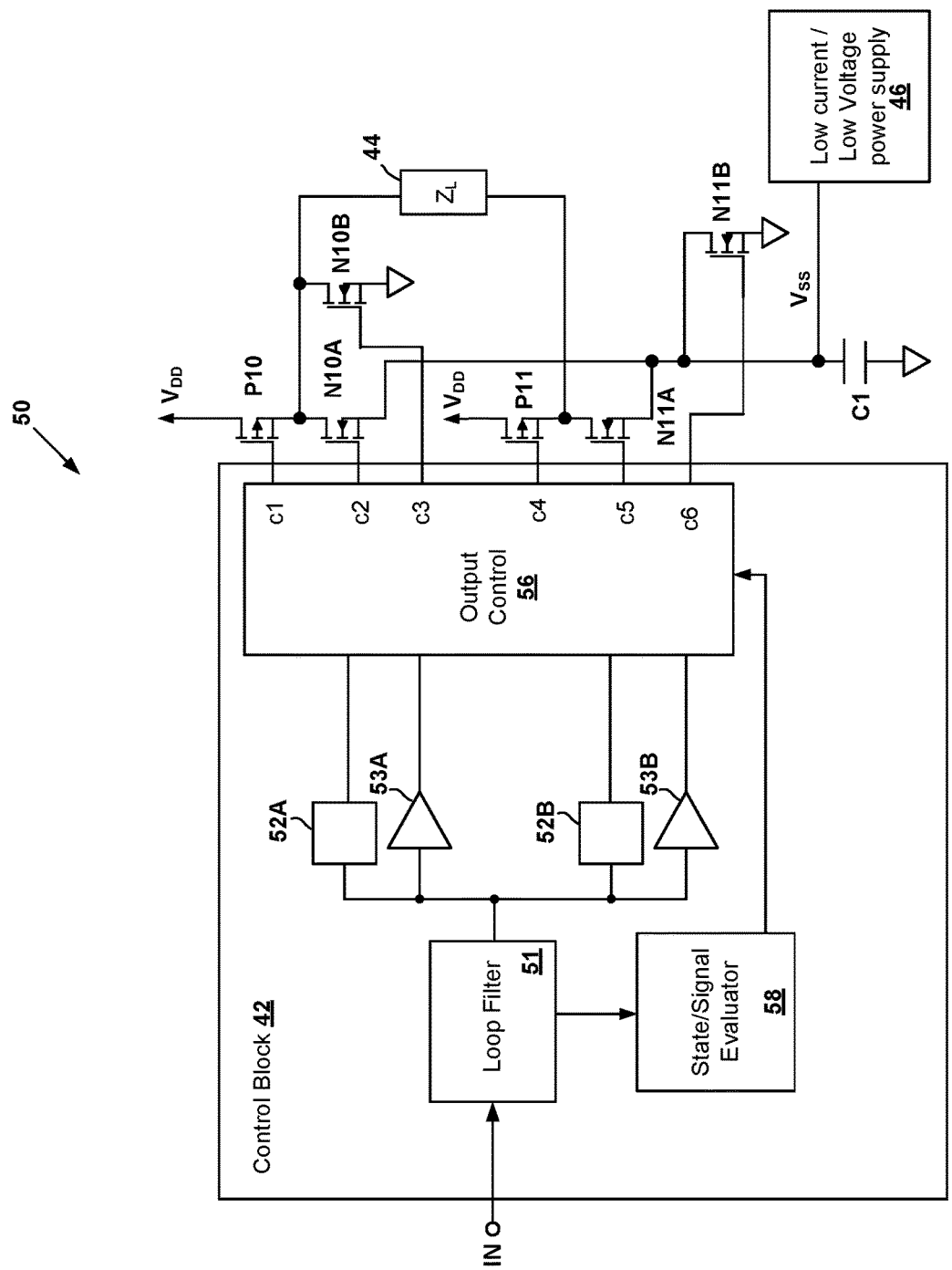
FIG. 6, is a block diagram of an example class-D amplifier 50, in accordance with another embodiment of the disclosure.

Referring now to FIG. 6, a block diagram of example class-D amplifier 50 is shown, in accordance with another embodiment of the disclosure. A control block 42 provides control signals to a pair of half-bridge drivers formed by transistors P10, N10A and P11, N11A, respectively, which provide a power output signal across a load 44, which may be an audio transducer, such as a speaker, a haptic driver, or another device to which power is to be supplied. A pair of transistors N10B, N11B may be included to provide a high-current return path as described in further detail below. Control block 42 receives an audio (or other) input signal IN and generates control signals c1-c6, which activate transistors P10, N10A, N10B and P11, N11A, N11B to produce the output signal across a load 44, as described in further detail below. A low current/low voltage power supply 46, which may be a charge-pump, low dropout (LDO) regulator, a switched-capacitor/switching power supply or the like, may generate the negative power supply rail $V_{SS}$ used by the half-bridge drivers formed by transistors P10, N10A and P11, N11A, while the positive power supply rail $V_{DD}$ is generally provided from an ordinary power supply with a greater output current capacity and voltage. For example, positive power supply rail $V_{DD}$ may have a voltage of 5 VDC, while negative power supply rail $V_{SS}$ may have a voltage of 0.5V, which is a reduction in voltage by a magnitude of 10, and a reduction in required output current by a factor of approximately 100. So, for example, example class-D amplifier 50 may require a power supply output of 100 mA from positive power supply rail $V_{DD}$ while the maximum current required from negative power supply rail $V_{SS}$ may only be 1 mA, which can be provided by a simple charge pump that charges capacitor C1. Thus, the power supply voltages provided to example class-D amplifier are asymmetric, and for large output signal amplitudes, the Class-D amplifier operates as a single-sided pulse-width modulated (PWM) class-D amplifier with a selected half-bridge driver supplying the PWM signal to one terminal of load 44, while the unselected half-bridge driver supplies a constant voltage to the other terminal of load 44. For lower signal amplitudes, the negative power supply rail $V_{SS}$ generated by low-current/low-voltage power supply 46 is used to provide low distortion operation at lower signal amplitudes near zero-crossings of the output signal, while only requiring a unipolar power supply. Transistors N10B, N11B may provide the return current path to ground when high signal amplitudes are being produced, e.g., when larger pulse-widths switching power supply rail $V_{DD}$ are provided to load 44 from the opposite half-bridge. While the depicted example class-D amplifier 10 operates with a low voltage/low current negative power supply rail, it is understood that low current/low voltage power supply 46 may alternatively generate the positive power supply rail, and that negative power supply rail $V_{SS}$ may be provided from an ordinary power supply with a greater output current capacity and voltage.

Within control block 42, a loop filter 51 receives input signal IN and feedback signals from outputs OUTA, OUTB of example class-D amplifier 50 and generates an output signal that is received by a pair of modulators 52A, 52B and optionally, a pair of linear amplifiers 53A, 53B in some embodiments. In some embodiments, modulators 52A, 52B might be replaced by a single modulator and optional linear amplifiers 53A, 53B may be replaced by a single linear amplifier. Modulators 52A, 52B may be PWM modulators, or other suitable modulators such as constant-edge modulation (CEM) modulators. Output control circuit 56 may include circuits to condition the output signals c1, c2, c4, c5 that are provided to the gates of transistors P10, N10A and P11, N11A, also includes selector circuitry when optional linear amplifiers 53A, 53B are used, to select linear operation, and may include linear bias circuitry if a single linear amplifier 53A is used. Output control 56 also includes logic and drive circuitry to activate transistors N10B, N11B, to provide a return current path when the opposite half-bridge is selected for modulated operation at higher current levels. For example, output control 56 may pre-bias transistors P10, N10A and P11, N11A for fast turn-on, and when linear amplifiers 53A, 53B are included, to bias transistors P10, N10A and P11, N11A for linear operation, e.g., in a class-AB bias configuration. Output control switches block 56 controls the alternating operation of the half-bridges formed by transistors P10, N10 and P11, N11 and a state/signal evaluator 58 provides information used to determine when to switch active operation between the half-bridge formed by transistors P10, N10A, N10B and the half-bridge formed by transistors P11, N11A, N11B to turn on transistor N10B or N11B and turn off transistor P10 or P11 in the half-bridge not selected for active operation. While the illustrated switching waveforms described below illustrate non-overlapping operation of the half-bridge formed by transistors P10, N10A, N10B and the half-bridge formed by transistors P11, N11A, N11B during low output signal amplitude intervals, overlap may be permitted, or as described above, linear operation may be provided using linear amplifiers 53A, 53B at low output signal amplitudes.

Figure 7A:
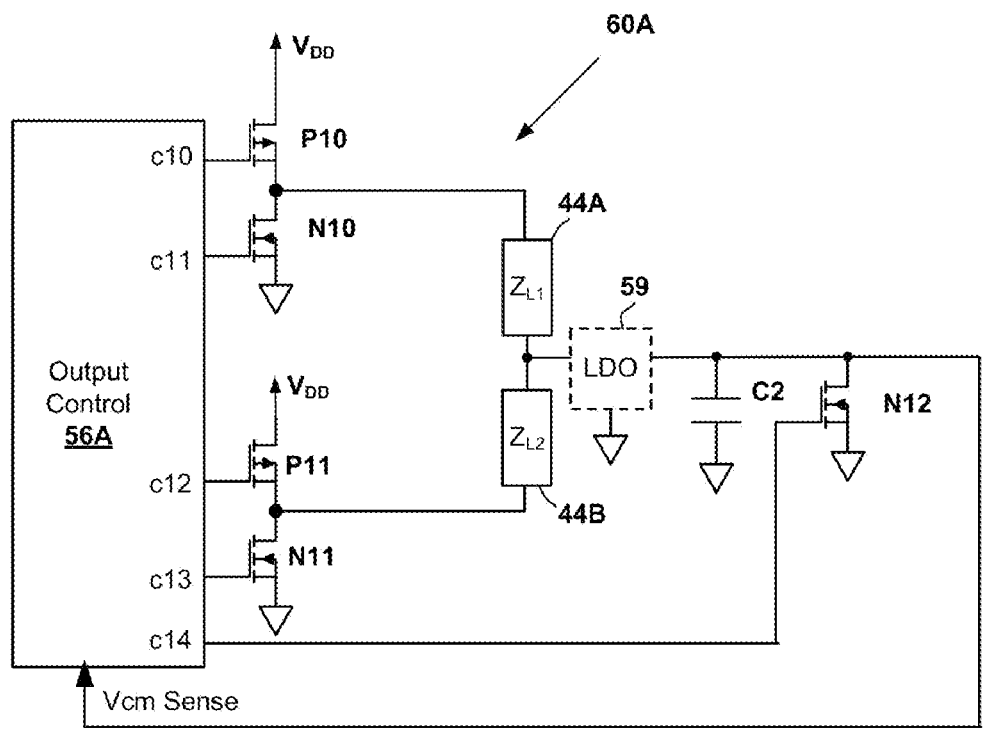
FIGS. 7A-7C are simplified schematic diagrams showing example alternative output circuits 60A-60C that may be used in example class-D amplifier 50, in accordance with various embodiments of the disclosure.

Referring now to FIG. 7A, an example alternative output circuit 60A that may be used to replace output control 56 and the H-bridge circuits in example class-D amplifier 50 of FIG. 6 is shown, in accordance with another embodiment of the disclosure. The depicted embodiment can be used when the load is split into a pair of loads 44A, 44B, such as when example class-D amplifier 50 is driving a dual voice coil transducer or haptic device. A capacitor C2 holds a common-mode voltage produced when the half-bridges formed by pairs of transistors P10, N10 and P11, N11 are switching, and a transistor N12 provides a mechanism to discharge capacitor C2 to a voltage near ground. An optional low-dropout (LDO) regulator 59 may be included to provide, for example, a −0.5V common-mode voltage, while transistor N10 or transistor N11 are actively switched or linearly operated to produce a low-current waveform across loads 44A, 44B that is near a zero-crossing, and transistor N12 may be activated when larger signals are being reproduced, to increase the efficiency and output swing of output circuit 60A. A feedback signal Vcm sense may be provided to output control 56A and/or to modulators 52A, 52B of FIG. 6 to adjust the modulator duty-cycle to maintain the voltage across capacitor C2 at the desired level.

Figure 7B:
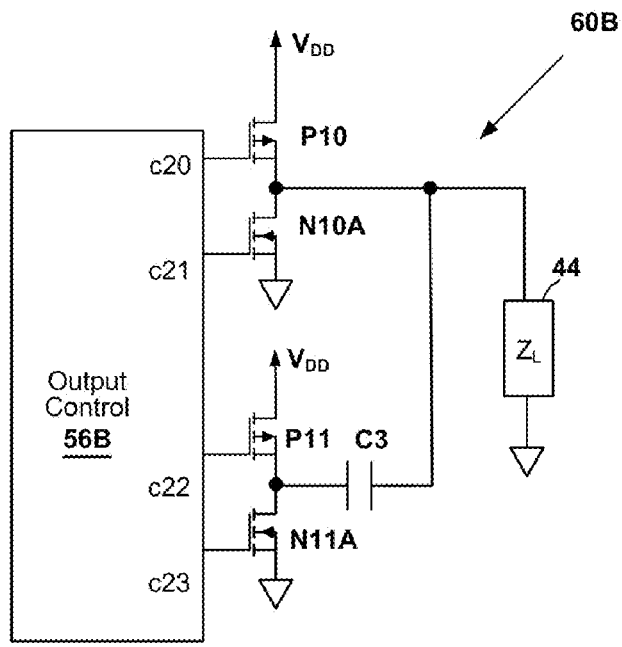

Referring now to FIG. 7B, another example alternative output circuit 60B that may be used to replace output control 56 and the H-bridge circuits in example class-D amplifier 50 of FIG. 6 is shown, in accordance with another embodiment of the disclosure. A capacitor C3 is coupled between the half-bridge formed by transistors P11, N11A and load 44, while transistors P10, N10A are configured as illustrated in FIG. 6. When transistor P10 and transistor N11A are active, capacitor C3 charges toward positive power supply rail $V_{DD}$ and, when transistor P10 is de-activated and transistor N11A remains active, the common-mode voltage shifts to produce a negative voltage pulse across load 44. Capacitor C3 can be sized to provide an appropriate range of voltage shifts, or a regulator may be employed to control the voltage across capacitor C3, or the voltage across capacitor C3 may be sensed, with feedback provided to control the pulse-width of the modulator(s) in class-D amplifier 50.

Figure 7C:
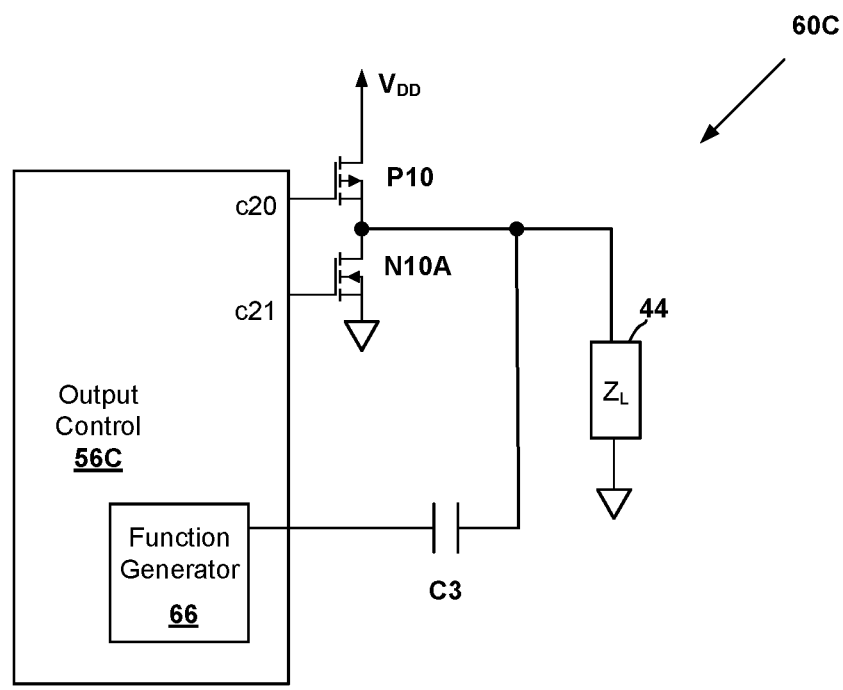

Referring now to FIG. 7C, another example alternative output circuit 60C that may be used to replace output control 56 and the H-bridge circuits in example class-D amplifier 50 of FIG. 6 is shown, in accordance with another embodiment of the disclosure. A capacitor C3 is coupled between a function generator 66 provided in output control 56C, while transistors P10, N10A are configured as illustrated in FIG. 6. When transistor P10 is active, capacitor C3 charges toward positive power supply rail $V_{DD}$ and, when transistor P10 is de-activated, the common-mode voltage shifts to produce a negative voltage pulse across load 44 as controlled by a triggered waveform at the output of function generator 66, which may be a ramp or other shaped waveform that reduces the "spike" that is otherwise produced at the transition. Capacitor C3 can be sized to provide an appropriate range of voltage shifts.

Referring now to FIG. 8, an example waveform diagram illustrates operation of example class-D amplifier 50 in accordance with an embodiment of the disclosure, as described above with reference to FIG. 6. Initially, transistor P10 is periodically operated to generate the output voltage required at output OUTA via control signal c1 to reproduce an output signal corresponding to input signal IN, while transistor N11B is activated via control signal c6. At a time $T_1$, control signal c2 activates transistor N10A, while transistor N11B remains active, producing the low-amplitude negative pulses seen on output OUTA, which drive the output signal toward the zero-crossing. At a time $T_2$, control signal c6 is de-asserted to deactivate transistor N11B, and control signal c3 is activated to activate transistor N10B. Control signal c5 is pulsed to generate a low-amplitude positive pulse at output OUTB, and then control signals c4 and c5 are shown pulsing to generate the corresponding low-amplitude and high-amplitude pulses seen at output OUTB.

Figure 9:
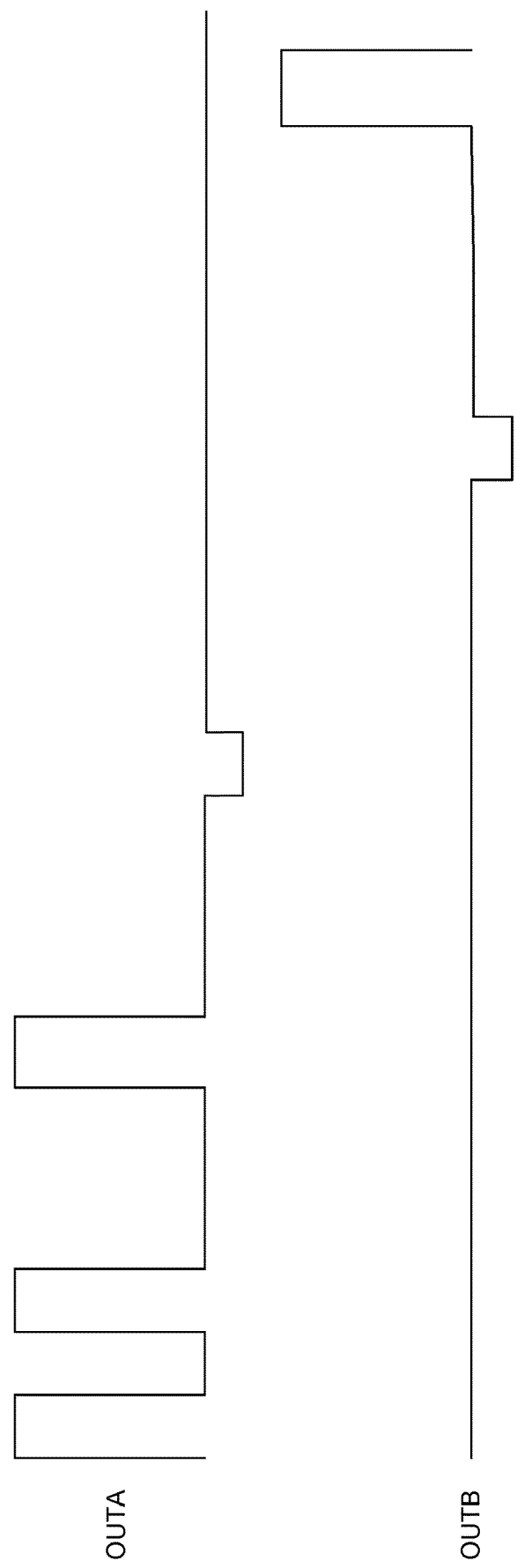

Referring now to FIG. 9, an example waveform diagram illustrates operation of example class-D amplifier 50 in accordance with another embodiment of the disclosure, as described above with reference to FIG. 6, and illustrates a principle which may be applied to any of the above-described embodiments. In FIG. 9, at a time $T_3$, when a zero-crossing is being produced, the period between pulses in output signals OUTA, OUTB is increased, providing finer control of the output voltage/current than would otherwise be available in operating the modulator at a fixed frequency.

Figure 10:
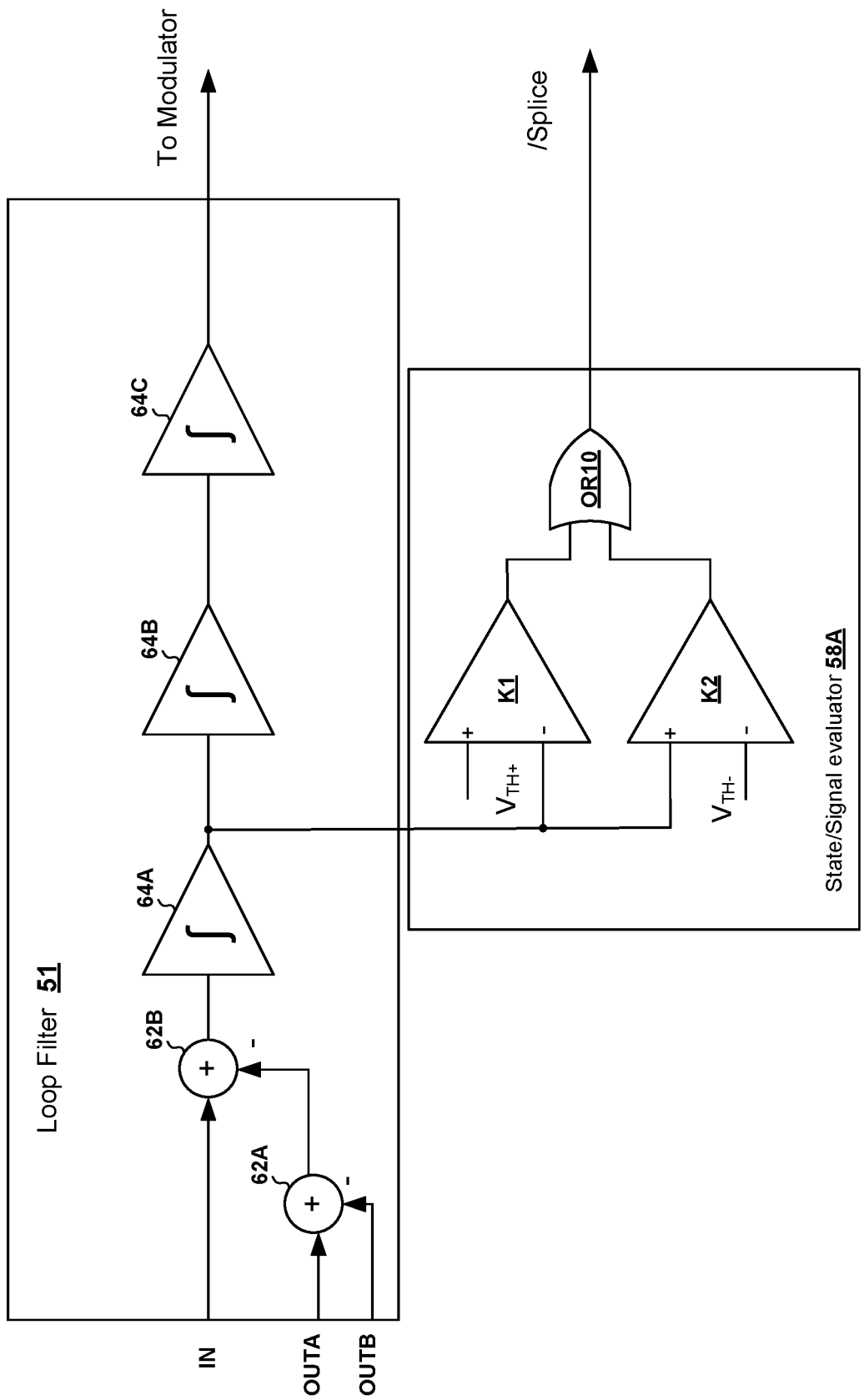
FIG. 10 is a simplified schematic diagram of an example loop filter 51A circuit and an example state/signal evaluator circuit 58A that may be used to implement loop filter 51 and state/signal evaluator 58 of FIG. 6, in accordance with an embodiment of the disclosure.

Referring now to FIG. 10, an example loop filter 51A circuit and an example state/signal evaluator circuit 58A that may be used to implement loop filter 51 and state/signal evaluator 58 of FIG. 6 are shown, in accordance with an embodiment of the disclosure. Loop filter 51A receives input signal IN and a combiner 62B subtracts a feedback signal provided by a combiner 62A to produce an error signal that is provided to a cascaded plurality of integrators 64A-64C. Combiner 62A subtracts the feedback signals from outputs OUTA and OUTB to produce the error signal input to combiner 62B. Integrators 64A-64C generate an output signal To Modulator that is provided to the input of modulators 52A, 52B and to optional linear amplifiers 53A, 53B of FIG. 6. One or more control signals K optionally provide for adjustment of the response of integrators, for example, when input signal IN is approaching a zero-crossing in order to increase the availability of "splice points" where the selection between selected (active) half-bridges can be made, to change the noise-shaping function of the modulator loop when a zero-crossing is approached to reduce the amount of out-of-band energy present, and/or when linear operation is selected by output control 56 of FIG. 6 in embodiments where linear amplifiers 53A, 53B are included. In state/signal evaluator 58A, a pair of comparators K1, K2 determine when the output of integrator 64A has a magnitude greater than a threshold voltage $V_{TH}$ and generates a control signal/Splice via a logical-OR gate OR10 that may be provided to output control 56 and/or modulators 52A, 52B to change operating state when the error level is low, e.g., to change the output polarity/selected (modulated) half-bridge. Other evaluations of the state variables of loop filter 51 may be made, and the example using comparators K1, K2 to evaluate the output of integrator 64A is only one such example of a loop state evaluator.

In summary, this disclosure shows and describes circuits and integrated circuits having Class-D amplifiers that in some embodiments include a first differential modulator circuit, a first driver circuit including a first high-side switch coupling the first output of the class-D amplifier to a positive power supply and a first low-side switch coupling the first output of the class-D amplifier to a negative power supply. An input of the first driver circuit may be coupled to a first output of the first differential modulator circuit so that the first differential modulator circuit controls the first driver circuit. The class-D amplifier may also include a second driver circuit including a second high-side switch coupling a second output of the class-D amplifier to a positive power supply and a second low-side switch coupling the second output of the class-D amplifier to a negative power supply, and may include control logic that selects between a single-ended operating state and a differential operating state of the class-D amplifier circuit. The control logic may have a first input coupled to a second output of the first differential modulator circuit, and an input of the second driver circuit may be coupled to an output of the control logic block. The control logic may selectively determine the input of the second driver circuit in conformity with a current operating state of the class-D amplifier circuit.

In some example embodiments, the Class-D amplifier includes a second differential modulator circuit having an output coupled to a second input of the control logic, and the control logic, in response to selection of the single-ended operating state as the current operating state of the class-D amplifier circuit, determines the input of the second driver circuit from the output of the second differential modulator circuit, and responsive to selection of the differential operating state as the current operating state of the class-D amplifier circuit, determines the input of the second driver circuit from the second output of the first differential modulator circuit. In some embodiments, the control logic couples the output of the first differential modulator to the input of the first driver circuit and modifies the first output of the first differential modulator circuit to shift a common-mode voltage of the first driver circuit. In some embodiments, the first single-ended driver further includes a first feedback driver circuit including a third high-side switch coupling a first feedback node to a positive power supply and third low-side switch coupling the first feedback node to a negative power supply, and the control logic further couples an input of the first feedback driver circuit to a second output of the first differential modulator circuit, and the control logic shifts an average voltage at the output of the first driver circuit to a value near a voltage of the negative power supply or a voltage of the positive power supply. In some embodiments, the control logic modifies the first output of the first differential modulator circuit and the second output of the first differential modulator circuit so that when the first output of the first differential modulator circuit and the second output of the first differential modulator circuit are equal, the first output of the first differential modulator circuit as provided to the first driver circuit and the second output of the first differential modulator circuit as provided to the first feedback driver are both forced to a given one of a positive state or a negative state, so that the first driver circuit and the first feedback driver may only assume different states or the given positive or negative state.

In some example embodiments, the class-D amplifier circuit may include second control logic that modifies the first output of the second differential modulator circuit to control a common-mode voltage of the second single-ended driver when the single-ended operating state is selected as the current operating state of the class-D amplifier circuit. The second single-ended driver may further include a second feedback driver circuit including a fourth high-side switch coupling a second feedback node to a positive power supply and fourth low-side switch coupling the second feedback node to a negative power supply, and the second control logic may couple an input of the second feedback driver circuit to a second output of the second differential modulator circuit. The control logic may shift an average voltage at the output of the second driver circuit to the value near the voltage of the negative power supply or the voltage of the positive power supply. The second control logic may modify the first output of the second differential modulator circuit and the second output of the second differential modulator circuit, so that when the first output of the second differential modulator circuit and the second output of the second differential modulator circuit are equal, the first output of the second differential modulator circuit as provided to the second driver circuit and the second output of the second differential modulator circuit as provided to the second feedback driver are both forced to a second given one of a positive state or a negative state, so that the second driver circuit and the second feedback driver may only assume different states or the second given positive or negative state.

In other example embodiments, the class-D amplifier circuit may include a control circuit having an input for receiving an input signal to be reproduced by the class-D amplifier circuit. The control circuit may have a first output coupled to an input of the first driver circuit and a second output coupled to an input of the second driver circuit, and the control circuit may include one or more modulators and select between actively operating a selected one of the first driver circuit or the second driver circuit or both the first driver circuit and the second driver circuit according to the signal to be reproduced, while setting an unselected one of the first driver circuit or the second driver circuit to turn either a high-side switch or a low-side switch of the unselected one of the first driver circuit or the second driver circuit fully on for at least some cycles of the one or more modulators.

In some example embodiments, the control circuit may comprise a state/signal evaluator coupled with the one or more modulators. The state/signal evaluator may determine a splice point at which the control circuit selects between actively operating the selected one of the first driver circuit or the second driver circuit or both the first driver circuit and the second driver circuit. In some example embodiments, a first one of the negative power supply or the positive power supply may have a first voltage with a first magnitude substantially less than a second magnitude of a second one of the negative power supply or the positive power supply. In some example embodiments, a ratio of the second magnitude to the first magnitude may be greater than or equal to 10, whereby a first power supply current required from the first power supply is less than a second power supply current required from the second power supply by a factor of 100 or more. In some example embodiments, the one or more modulators may have a selectable operating rate that is reduced during a time interval during which the control circuit selects between actively operating the first driver circuit and the second driver circuit. In some example embodiments, the control circuit may select between operating the first driver circuit and the second driver circuit by comparing an integrated error between the signal to be reproduced and the feedback signal.

In some example embodiments, the control circuit may include a loop filter that filters an error signal generated from feedback from the first output and the second output of the class-D amplifier and the input signal. The operation of the loop filter may be adjusted when the input signal is approaching a zero-crossing to change the noise-shaping function of the modulator loop when a zero-crossing is approached to reduce the amount of out-of-band energy present in order to increase the availability of splice points. In some example embodiments, wherein the first driver circuit may include a third switch coupling the first output of the class-D amplifier to an alternate return power supply rail, and the second driver circuit may include a fourth switch coupling the second output of the class-D amplifier to the alternate return power supply rail. In some example embodiments, the control circuit selects between operating the first driver circuit from the positive power supply, the negative power supply or the alternate return power supply rail and further selects between operating the first driver circuit from the positive power supply, the negative power supply or the alternate return power supply rail.

In some example embodiments, the first output and the second output of the Class-D amplifier may be outputs for driving a split load having a common return terminal that connects portions of the split load, and the Class-D amplifier circuit may further include a capacitor coupled between the common return terminal and either that positive power supply or the negative power supply, so that when the control circuit changes the selection of the selected one of the first driver circuit or the second driver circuit, a voltage stored on the capacitor provides additional signal swing of the selected driver circuit. In some example embodiments, the class-D amplifier may further include a shunt transistor for shunting the capacitor to one of the first power supply or the second power supply to improve efficiency outside of the regions in which the signal to be reproduced has low amplitude. In some example embodiments, the first output and the second output of the class-D amplifier may be connected together, and the class-D amplifier may further include a series capacitor coupled between the output of the second driver circuit and the second output of the class-D amplifier. The series capacitor may be charged when the first driver circuit is selected for active operation by the control circuit, so that when the control circuit changes the selected driver circuit from the first driver circuit to the second driver circuit, a voltage stored on the capacitor provides additional signal swing of the output of the class-D amplifier.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in an IC that includes either internal or external switching transistors.

What is claimed is:

1. A class-D amplifier circuit, comprising:
   a first driver circuit including a first high-side switch coupling a first output of the class-D amplifier to a positive power supply and a first low-side switch coupling the first output of the class-D amplifier to a negative power supply;
   a second driver circuit including a second high-side switch coupling a second output of the class-D amplifier to a positive power supply and a second low-side switch coupling the second output of the class-D amplifier to a negative power supply; and
   a control circuit having an input for receiving an input signal to be reproduced by the class-D amplifier circuit, the control circuit having a first output coupled to an input of the first driver circuit and a second output coupled to an input of the second driver circuit, wherein the control circuit includes one or more modulators and selects between actively operating a selected one of the first driver circuit or the second driver circuit or both the first driver circuit and the second driver circuit according to the signal to be reproduced, while setting an unselected one of the first driver circuit or the second driver circuit to turn either a high-side switch or a low-side switch of the unselected one of the first driver circuit or the second driver circuit fully on for at least some cycles of the one or more modulators.

2. The class-D amplifier circuit of claim 1, wherein the control circuit comprises a state/signal evaluator coupled with the one or more modulators, wherein the state/signal evaluator determines a splice point at which the control circuit selects between actively operating the selected one of the first driver circuit or the second driver circuit or both the first driver circuit and the second driver circuit.

3. The class-D amplifier circuit of claim 2, wherein a first one of the negative power supply or the positive power supply has a first voltage with a first magnitude substantially less than a second magnitude of a second one of the negative power supply or the positive power supply.

4. The class-D amplifier circuit of claim 3, wherein a ratio of the second magnitude to the first magnitude is greater than or equal to 10, whereby a first power supply current required from the first power supply is less than a second power supply current required from the second power supply by a factor of 100 or more.

5. The class-D amplifier of claim 1, wherein the one or more modulators have a selectable operating rate that is reduced during a time interval during which the control circuit selects between actively operating the first driver circuit and the second driver circuit.

6. The class-D amplifier of claim 1, wherein the control circuit selects between operating the first driver circuit and the second driver circuit by comparing an integrated error between the signal to be reproduced and a feedback signal.

7. The class-D amplifier circuit of claim 1, wherein the control circuit comprises a loop filter that filters an error signal generated from feedback from the first output and the second output of the class-D amplifier and the input signal, wherein the operation of the loop filter is adjusted when the input signal is approaching a zero-crossing to change a noise-shaping function of the modulator loop when a zero-crossing is approached, to reduce the amount of out-of-band energy present in order to increase the availability of splice points.

8. The class-D amplifier of claim 1, wherein the first driver circuit further includes a third switch coupling the first output of the class-D amplifier to an alternate return power supply rail, wherein the second driver circuit further includes a fourth switch coupling the second output of the class-D amplifier to the alternate return power supply rail, and wherein the control circuit selects between operating the first driver circuit from the positive power supply, the negative power supply or the alternate return power supply rail and further selects between operating the first driver circuit from the positive power supply, the negative power supply or the alternate return power supply rail.

9. The Class-D amplifier circuit of claim 1, wherein the first output and the second output of the Class-D amplifier are outputs for driving a split load having a common return terminal that connects portions of the split load, and wherein the Class-D amplifier circuit further comprises a capacitor coupled between the common return terminal and either the positive power supply or the negative power supply, so that when the control circuit changes the selection of the selected one of the first driver circuit or the second driver circuit, a voltage stored on the capacitor provides additional signal swing of the selected driver circuit.

10. The class-D amplifier of claim 9, further comprising a shunt transistor for shunting the capacitor to one of the first power supply or the second power supply to improve efficiency outside of the regions in which the signal to be reproduced has low amplitude.

11. The class-D amplifier circuit of claim 1, wherein the first output and the second output of the class-D amplifier are connected together, and further comprising a series capacitor coupled between the output of the second driver circuit and the second output of the class-D amplifier, wherein the series capacitor is charged when the first driver circuit is selected for active operation by the control circuit, so that when the control circuit changes the selected driver circuit from the first driver circuit to the second driver circuit, a voltage stored on the capacitor provides additional signal swing of the output of the class-D amplifier.

12. A method of operating a class-D amplifier circuit, comprising:
producing a first power output signal of the class-D amplifier circuit from a first driver circuit including a first high-side switch coupling the first output of the class-D amplifier to a positive power supply and a first low-side switch coupling the first output of the class-D amplifier to a negative power supply;
producing a second power output signal of the class-D amplifier circuit from a second driver circuit including a second high-side switch coupling a second output of the class-D amplifier to a positive power supply and a second low-side switch coupling the second output of the class-D amplifier to a negative power supply;
receiving an input signal to be reproduced by the class-D amplifier circuit;
generating a first output of a control circuit coupled to an input of the first driver circuit;
generating a second output of a control circuit coupled to an input of the second driver circuit;
selecting between actively operating a selected one of the first driver circuit or the second driver circuit or both the first driver circuit and the second driver circuit with one or more modulators of the control circuit according to the signal to be reproduced; and
setting an unselected one of the first driver circuit or the second driver circuit to turn either a high-side switch or a low-side switch of the unselected one of the first driver circuit or the second driver circuit fully on for at least some cycles of the one or more modulators.

13. The method of claim 12, further comprising determining a splice point at which the selecting selects between actively operating the selected one of the first driver circuit or the second driver circuit or both the first driver circuit and the second driver circuit according to an output of a state/signal evaluator.

14. The method of claim 13, wherein a first one of the negative power supply or the positive power supply has a first voltage with a first magnitude substantially less than a second magnitude of a second one of the negative power supply or the positive power supply.

15. The method of claim 14, wherein a ratio of the second magnitude to the first magnitude is greater than or equal to 10, whereby a first power supply current required from the first power supply is less than a second power supply current required from the second power supply by a factor of 100 or more.

16. The method of claim 12, further comprising selecting an operating rate of the one or more modulators to be reduced during a time interval during which the selecting selects between actively operating the first driver circuit and the second driver circuit.

17. The method of claim 12, wherein the selecting selects between operating the first driver circuit and the second driver circuit by comparing an integrated error between the signal to be reproduced and a feedback signal.

18. The method of claim 12, further comprising:
generating an error signal from feedback from the first output and the second output of the class-D amplifier and the input signal;
filtering the error signal with a loop filter; and
adjusting the operation of the loop filter when the input signal is approaching a zero-crossing to change the noise-shaping function of a modulator loop when a zero-crossing is approached, to reduce the amount of out-of-band energy present in order to increase the availability of splice points.

19. The method of claim 12, wherein the first driver circuit further includes a third switch coupling the first output of the class-D amplifier to an alternate return power supply rail, wherein the second driver circuit further includes a fourth switch coupling the second output of the class-D amplifier to the alternate return power supply rail, and wherein the selecting selects between operating the first driver circuit from the positive power supply, the negative power supply or the alternate return power supply rail and further selects between operating the first driver circuit from the positive power supply, the negative power supply or the alternate return power supply rail.

20. The method of claim 12, wherein the first output and the second output of the Class-D amplifier are outputs for driving a split load having a common return terminal that connects portions of the split load, and wherein the method further comprises coupling a capacitor coupled between the common return terminal and either the positive power supply or the negative power supply, so that when the selecting changes the selection of the selected one of the first driver circuit or the second driver circuit, a voltage stored on the capacitor provides additional signal swing of the selected driver circuit.

21. The method of claim 20, further comprising shunting the capacitor to one of the first power supply or the second power supply with a transistor to improve efficiency outside of the regions in which the signal to be reproduced has low amplitude.

22. The method of claim 12, wherein the first output and the second output of the class-D amplifier are connected together, and further comprising providing a series capacitor coupled between the output of the second driver circuit and the second output of the class-D amplifier, wherein the series capacitor is charged when the first driver circuit is selected for active operation by the selecting, so that when the selecting changes the selected driver circuit from the first driver circuit to the second driver circuit, a voltage stored on the capacitor provides additional signal swing of the output of the class-D amplifier.

* * * * *